(12) United States Patent
de Goeje et al.

(10) Patent No.: US 6,649,224 B1
(45) Date of Patent: Nov. 18, 2003

(54) METHOD FOR APPLYING A COATING TO A SUBSTRATE

(75) Inventors: Marius Pieter de Goeje, Delft (NL); Peter Hillebrand de Haan, Delft (NL); Gerardus Titus van Heck, Eindhoven (NL)

(73) Assignee: Nederlandse Organisatie voor toegepast-natuurwetenschappelijk Onderzoek TNO (NL)

( * ) Notice: Subject to any disclaimer, the term of this patent is extended or adjusted under 35 U.S.C. 154(b) by 0 days.

(21) Appl. No.: 09/763,764

(22) PCT Filed: Aug. 27, 1999

(86) PCT No.: PCT/NL99/00533
§ 371 (c)(1),
(2), (4) Date: May 7, 2001

(87) PCT Pub. No.: WO00/12778
PCT Pub. Date: Mar. 9, 2000

(30) Foreign Application Priority Data

Aug. 27, 1998 (NL) .............................. 1009956

(51) Int. Cl.[7] .................................. H05H 1/24
(52) U.S. Cl. ............. 427/578; 427/255.28; 427/255.37; 427/255.393; 427/255.395; 427/296
(58) Field of Search ................................ 427/569, 574, 427/579, 255.28, 255.37, 255.393, 255.395, 296, 578

(56) References Cited

U.S. PATENT DOCUMENTS 4,107,049 A * 8/1978 Sano et al. .................. 210/490
5,527,629 A * 6/1996 Gastiger et al. ............ 428/688

FOREIGN PATENT DOCUMENTS

DE 19515069 A1 * 10/1996
EP 0577447 A1 * 1/1994

OTHER PUBLICATIONS

R. Thyen et al Plasma–Enhanced Chemical–Vapor–Deposition of Thin Films by Corona Discharge at Atmospheric Pressure, *Surface and Coating Technology*, pp. 426–434, (No month available) 1997.*

* cited by examiner

*Primary Examiner*—Bernard Pianalto
(74) *Attorney, Agent, or Firm*—Muserlian, Lucas and Mercanti, LLP

(57) ABSTRACT

A method of applying a coating to a surface of a substrate, comprising the steps of:
  introducing a substrate into an atmosphere which consists of at least one chemically reactive compound, water and at least one of nitrogen and argon, and thereafter
  using a corona discharge on the surface of the substrate to form a coating from the reactive compound having an inhibiting effect on the permeability to vapor and/or gas.

17 Claims, 1 Drawing Sheet

METHOD FOR APPLYING A COATING TO A SUBSTRATE

This application is a 371 of PCT/NL99/00533 dated Aug. 27, 1999.

FIELD OF THE INVENTION

This invention relates to the application of a coating to various substrates, including the application of barrier layers to plastics.

BACKGROUND OF THE INVENTION

The provision of coatings on all kinds of substrates, as on plastic film or on articles formed from plastic, on metals, or on other materials, is an important tool for improving the (surface) properties of such substrates. To be considered here are, for instance, improving the wear and/or scratch resistance of plastics, the corrosion resistance of metals, and especially improving the barrier properties of plastics, as in polyester bottles or polyester or polyolefin films. Particularly the last-mentioned application is of great commercial and technical importance, since the greater part of plastics have moderate to poor barrier properties in respect of oxygen and $CO_2$. This means that such plastics are less suitable for use as packing material for oxygen-and $CO_2$-sensitive materials and foods.

Plastic materials that have sufficient barrier properties are, for instance, PVDC, and laminates of non-barrier plastics and other plastics, such as EVOH and the like, or metals, such as aluminum, which have a good barrier function. The use of this kind of systems, however, meets with other objections, for instance from an environmental point of view. On the one hand, chlorine containing plastics are less desirable specifically in garbage incineration, while, on the other hand, multilayer systems possess disadvantages from the viewpoint of reuse.

OBJECTS AND SUMMARY OF THE INVENTION

Accordingly, there is a need for a system enabling a coating to be applied to a plastic or any other substrate, which coating imparts to the substrate additional useful properties. The present invention now provides for this need.

The invention relates, in a first variant, to a method for applying a coating to at least one surface of a substrate, wherein the substrate is introduced into an atmosphere which contains at least one chemically reactive compound and water, and subsequently, using a corona discharge, on the surface of the substrate a coating is formed from the reactive compound.

Surprisingly, it has been found to be possible to form a coating by activating a suitable chemically reactive compound using a corona discharge, in the presence of water, to form a coating on the surface with good properties. Suitable reactive compounds include inter alia silicon-containing compounds which can be brought into the gas phase, such as silanes and siloxanes.

It has been found that for obtaining good properties in respect of the permeability to vapor and/or gas, the presence of water is essential. In case an anhydrous gas phase is used in the corona treatment, the coating obtained is not sufficiently vapor/gas inhibiting. As soon as water is present in the gas phase, however, the permeability of the coating is found to be greatly reduced.

Preferably, the amount of water is more than 0.1% by volume, based on the volume of the gas phase, while the balance consists of inert gas and the chemically reactive compound. More preferably, the amount of water is at least 0.5% by volume, the upper limit being formed by the saturation vapor pressure. Obviously, it is dependent on the temperature, but will not exceed 5% by volume.

Suitable as chemically reactive compound are inter alia the compounds given in Table 1.

TABLE 1

Examples of reactive components for forming a coating on a substrate using the reactive corona technique.

| name | abbreviation | structure |
| --- | --- | --- |
| Hexamethyldisiloxane | HMDSO | $H_3C-Si(CH_3)_2-O-Si(CH_3)_2-CH_3$ |
| Tetraethoxysilane | TEOS | $Si(OCH_2CH_3)_4$ |
| 1,1,3,3-Tetramethyldisiloxane | TMDSO | $H-Si(CH_3)_2-O-Si(CH_3)_2-H$ |

TABLE 1-continued

Examples of reactive components for forming a coating on a substrate using the reactive corona technique.

| name | abbreviation | structure |
|---|---|---|
| 2,4,6,8,10-Pentamethylcyclopentasiloxane | — | (cyclic siloxane structure) |
| 1,1,3,3,5,5,7,7-Octamethyltetrasiloxane | — | H—Si(CH₃)₂—O—Si(CH₃)₂—O—Si(CH₃)₂—O—Si(CH₃)₂—H |

The choice of the compound depends on various factors. Primarily, the desired properties of the coating are of importance. What substrate the coating is to be applied to also plays a role.

Suitable substrates are especially metals and plastics. As has already been indicated, the invention can be advantageously used for imparting barrier properties to plastics that do not inherently possess these properties. Examples include polyester bottles and polypropylene films. These materials are often used for packing beverages and foods. It is then of importance that no oxygen can reach them, or that no $CO_2$ can escape. By applying a coating in the manner described hereinabove, a single-layer plastic having a coating thereon that does not give any adverse effects upon subsequent processing and/or reuse is obtained in a simple manner.

BRIEF DESCRIPTION OF THE DRAWINGS

The invention, together with further object and advantages thereof, may best be understood by reference to the following description taken in conjunction with the accompanying drawings wherein;

The FIGURE is a schematic view of the manner in which the method in accordance with the invention is practiced.

DETAILED DESCRIPTION OF THE INVENTION

Figure 1:
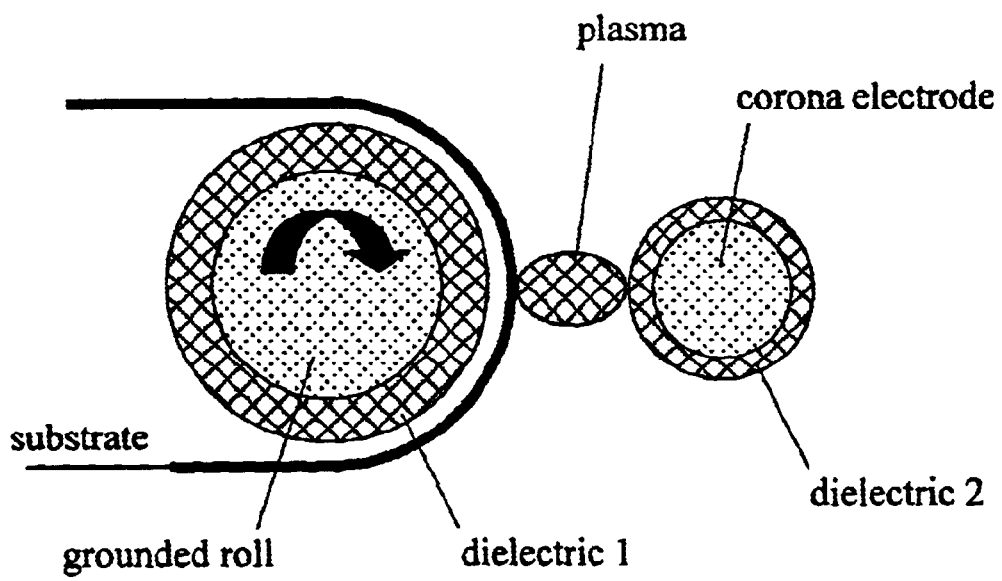

The coating is applied by contacting the surface with a gas phase in which at least one chemically reactive compound and water are present. The gas phase further contains inert gas, such as nitrogen, or noble gas, including argon.

Subsequently, in the presence of this gas phase, a corona treatment is carried out. Corona treatments are known per se, for instance for promoting adhesion of inks and glues to plastics.

A corona treatment consists in subjecting the surface to a corona discharge for a limited time (1 second to a few minutes). A corona discharge is a stable electrical discharge between two electrodes in a gas having a pressure of more than 0.2 bar (typically 0.8 to 1.0 bar). The discharge is maintained with an AC high voltage (voltage: 5 to 30 kV, frequency: 15 to 30 kHz). One or both of the electrodes is/are coated with a dielectric. A schematic representation of a set-up for corona treatment is given in the figure.

As shown in FIG. 1, the substrate to be coated is passed over a dielectric layer of a grounded roll. The corona electrode is also coated with a dielectric. The plasma field is formed between the two electrodes in contact with the substrate.

The pressure at which the treatment occurs is preferably at least 0.2 bar, more particularly at least 1 bar.

Finally, the invention further relates to a substrate having at least one surface provided with a coating. in the manner described hereinabove.

The invention will presently be elucidated in and by a few examples.

In an experimental set-up, flat films were provided with a coating produced with the reactive corona process. Two different substrate films were used, viz. a PET film, 12 $\mu$m thick, biaxially stretched, without further specifications, and a PP film, V47 PED 10 (Hoechst), 10 $\mu$m thick, stretched.

Different combinations of electrodes and dielectrics (see the figure) were used. These combinations are listed in Table 2.

TABLE 2

Overview of the different combinations of electrodes and dielectrics for the reactive corona.

| # | grounded roll | dielectric 1 | corona electrode | dielectric 2 | distance |
|---|---|---|---|---|---|
| 1 | metal, 100 mm φ | rubber, 2.3 mm | metal, 12.8 mm φ | — | 2–3 mm |
| 2 | metal, 100 mm φ | rubber, 2.3 mm | metal, 50 mm φ | — | 1.7 mm spacer |
| 3 | metal, 100 mm φ | rubber, 2.3 mm | metal, 50 mm φ | rubber, 2 mm | 1.7 mm spacer |
| 4 | metal, 100 mm φ | rubber, 2.3 mm | metal balls, 29.7 mm φ | glass tube, 1.8 mm | 2–3 mm |
| 5 | 'aquadag' 121 mm φ | ceramic, 10.1 mm | metal balls, 29.7 mm φ | glass tube, 1.8 mm | 1 mm spacer |

In configuration 5 the grounded roll is formed by a ceramic tube internally provided with a layer of 'aquadag', i.e. an electrically conductive graphite coating. In configurations 4 and 5 the corona electrode consists of a glass tube filled with metal balls as conducting electrode, The gas atmosphere in which the reactive component is introduced, and in which the corona discharge is induced, has an influence on the nature of the coating formed on the substrate. Table 3 gives an overview of the different gas compositions using which the substrate films were provided with a coating.

TABLE 3

Examples of the composition of the gas atmosphere in which the reactive component is included.

| | Composition |
|---|---|
| 1 | Nitrogen (dry), 0.9(a), 0.5(b), 0.2(c) bar |
| 2 | Nitrogen (wet, 0.9 bar) |

Coatings were applied to substrate films, under variation of the following conditions: electrode configuration, partial pressure of the reactive component, the composition and total pressure of the gas atmosphere, the power of the corona discharge, and the duration of the treatment. Subsequently, the oxygen-permeability of the films with coating was measured. The gas permeability of a film is expressed in $cm^3/m^2$ dag.bar. By way of example, Table 4 shows, by way of example, some results of the permeability of the PP film with coatings applied under different conditions. Summarized in the table are: the reactive component with the partial pressure, the gas atmosphere (see Table 3), the electrode configuration (see Table 2), the corona power, the treatment time, and the measured permeability to oxygen for different samples per condition. In these experiments, a film having a surface of about 0.05 $m^2$ was provided with a coating, In the experiments underlying the results of Table 4, the time duration of the corona treatment was varied. The permeability of the films with coating is compared with the permeability of the PP film without a coating (PP v).

TABLE 4

Permeability to oxygen of PP films with a coating applied by the reactive corona technique.

| exp. | reactive component | gas | config. | P [W] | t [min] | permeability [$cm^3/m^2$ dag.bar] |
|---|---|---|---|---|---|---|
| PPv | — | — | — | — | — | 3100 |
| PP 76 | TEOS, 1 mbar | 2 | 3 | 75 | 5 | 2400 2400 |
| PP 75 | TEOS, 1 mbar | 2 | 3 | 75 | 10 | 60 60 70 |
| PP 80 | TEOS, 1 mbar | 2 | 3 | 75 | 20 | 20 160 60 70 |

It is clear that the coating applied reduces the permeability of the film considerably. Measurements on the thickness of some of the coatings produced show that the thickness of the coating is in the order of magnitude of 0.1 to 1 μm.

In Table 5 some other results of the experiments are summarized. In these measurements, use was made of two types of gas atmosphere, viz. wet (2.3 vol. % water) nitrogen (2) and dry nitrogen. The coating was applied to a PP film and the reactive component is TEOS (partial pressure 1 mbar). The permeability of the films with coating is compared with the permeability of the PP film without a coating (PP v). It appears from the table that a wet nitrogen atmosphere results in a coating having a considerably lower permeability to oxygen than does a dry nitrogen atmosphere.

It further appears from the table that the reproducibility of the treatment is reasonably good.

TABLE 5

Permeability to oxygen of PP films with a coating applied by the reactive corona technique

| exp. | reactive component | gas | config. | P [W] | t [min] | permeability [$cm^3/m^2$ dag.bar] |
|---|---|---|---|---|---|---|
| PPv | — | — | — | — | — | 3100 |
| PP 80 | TEOS, 1 mbar | 2 | 3 | 75 | 20 | 20 160 60 70 |
| PP 81 | TEOS, 1 mbar | 2 | 3 | 75 | 20 | 70 |
| PP 87 | TEOS, 1 mbar | 1a | 3 | 75 | 20 | 850 |
| PP 88 | TEOS, 1 mbar | 1a | 3 | 75 | 20 | 2300 1800 |

Finally, Table 6 shows the permeability to oxygen of the PP film and the PET film with a coating applied using the reactive corona technique. The permeability of the films with coating is compared with the permeability of the corresponding films without coating (PET v and PP v, respectively).

TABLE 6

Permeability to oxygen of PP film and PET film with a coating applied by the reactive corona technique.

| exp. | reactive component | gas | config. | P [W] | t [min] | permeability [$cm^3/m^2$ dag.bar] |
|---|---|---|---|---|---|---|
| PET V | — | — | — | — | — | 103 70 |
| PET 91 | TEOS, 1 mbar | 2 | 3 | 75 | 20 | 40 9 8 6 |
| PPv | — | — | — | — | — | 3100 |
| PP 80 | TEOS, 1 mbar | 2 | 3 | 75 | 20 | 20 160 60 70 |

Again, there is a clear decrease of the oxygen permeability as a result of the application of a coating using the reactive corona technique.

What is claimed is:

1. A method of applying a coating to a surface or a substrate, comprising the steps of:
    introducing a substrate into an atmosphere which consists of at least one chemically reactive compound, water and at least one of nitrogen and argon, and thereafter
    using a corona discharge on the surface of the substrate to form a coating from the reactive compound having an inhibiting effect on the permeability to vapor and/or gas.

2. A method according to claim 1, further comprising the step of regulating the amount of water in the atmosphere such that the volume of water is greater than 0.1% by volume in the atmosphere.

3. A method according to claim 1, further comprising the step of regulating the amount of water in the atmosphere such that the volume of water is greater than 0.5% by volume in the atmosphere.

4. A method according to claim 1, wherein the pressure at which the corona discharge occurs is at least 0.2 bar.

5. A method according to claims 1, wherein the pressure at which the corona discharge occurs is at least 1 bar.

6. A method according to claim 1, wherein the chemically reactive compound is a reactive silicon compound.

7. A method for applying a coating to at least one surface of a substrate, wherein said substrate is introduced into an atmosphere which consists of at least one chemically reactive compound, water and at least one of nitrogen and argon, and wherein subsequently, using a corona discharge, on the surface of the substrate a coating is formed from said reactive compound and wherein said coating has an inhibiting effect on the permeability to vapor and/or gas.

8. A method according to claim 7, wherein the coating reduces the permeability of the plastic film to at least one of water vapor, $CO_2$ and oxygen.

9. A method according to claim 7, wherein the coating has corrosion-inhibiting activity.

10. A method according to claim 7, wherein the coating improves the wear resistance and scratch resistance of the surface of the film.

11. A method according to claim 7, wherein the amount of water is 0.1% by volume or more, preferably 0.5% by volume or more, based on the volume of the atmosphere.

12. A method according to claim 7, wherein the amount of water is not more than 5% by volume.

13. A method according to claim 7, further comprising the step of utilizing a polyester or a polyolefin material as the plastic film.

14. A method according, to claim 7, further comprising the step of utilizing a polyalkylene terephthalate or a polypropylene material as the plastic film.

15. A method according to claim 7, further comprising the step of utilizing a silane or a siloxane as the chemically reactive compound.

16. A method according to claim 7, further comprising the step of utilizing tetraethoxysilane as the chemically reactive compound.

17. A method according to claim 7, wherein the corona discharge occurs by applying a voltage of at least 5 kV.

* * * * *